United States Patent [19]

Tanimoto

[11] Patent Number: 5,048,926
[45] Date of Patent: Sep. 17, 1991

[54] ILLUMINATING OPTICAL SYSTEM IN AN EXPOSURE APPARATUS

[75] Inventor: Akikazu Tanimoto, Yokohama, Japan

[73] Assignee: Nikon Corporation, Tokyo, Japan

[21] Appl. No.: 313,472

[22] Filed: Feb. 22, 1989

[30] Foreign Application Priority Data

Feb. 29, 1988 [JP] Japan .................................. 63-47026

[51] Int. Cl.⁵ .............................................. G02B 27/14
[52] U.S. Cl. ..................................... 359/487; 359/495; 359/618
[58] Field of Search ................ 350/375, 376, 6.4, 622, 350/437, 171, 172, 174, 394, 622, 400, 401; 372/99, 95; 219/121.73, 121.74

[56] References Cited

U.S. PATENT DOCUMENTS

| | | | |
|---|---|---|---|
| 4,053,898 | 10/1977 | Hirayama et al. | 346/108 |
| 4,355,871 | 10/1982 | Nevyas et al. | 351/237 |
| 4,601,575 | 7/1986 | Tamaki | 356/124 |
| 4,619,508 | 10/1986 | Shibuya et al. | 353/122 |
| 4,669,088 | 5/1987 | Waite | 372/95 |
| 4,769,750 | 9/1988 | Matsumoto et al. | 362/268 |

Primary Examiner—Bruce Y. Arnold
Assistant Examiner—J. P. Ryan
Attorney, Agent, or Firm—Shapiro and Shapiro

[57] ABSTRACT

An illuminating optical system for illuminating an object comprises a light source emitting a radiation beam, means for dividing the radiation beam into a plurality of beams, a device for rotating at least one of the plurality of divided beams about an optic axis parallel to the direction of travel of the beam, and a deivce for superposing the divided beams one upon the other in a common area on the object.

22 Claims, 2 Drawing Sheets

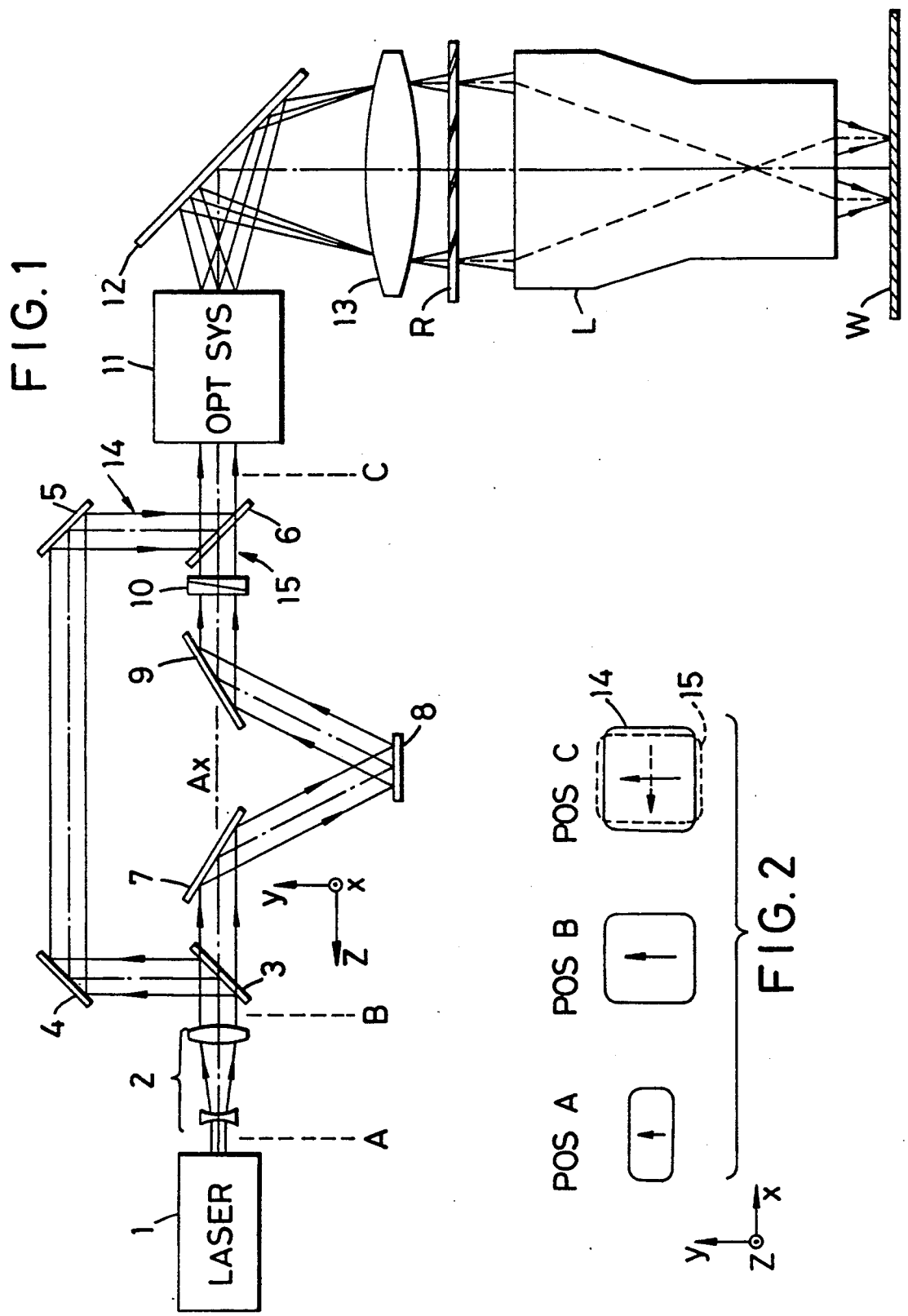

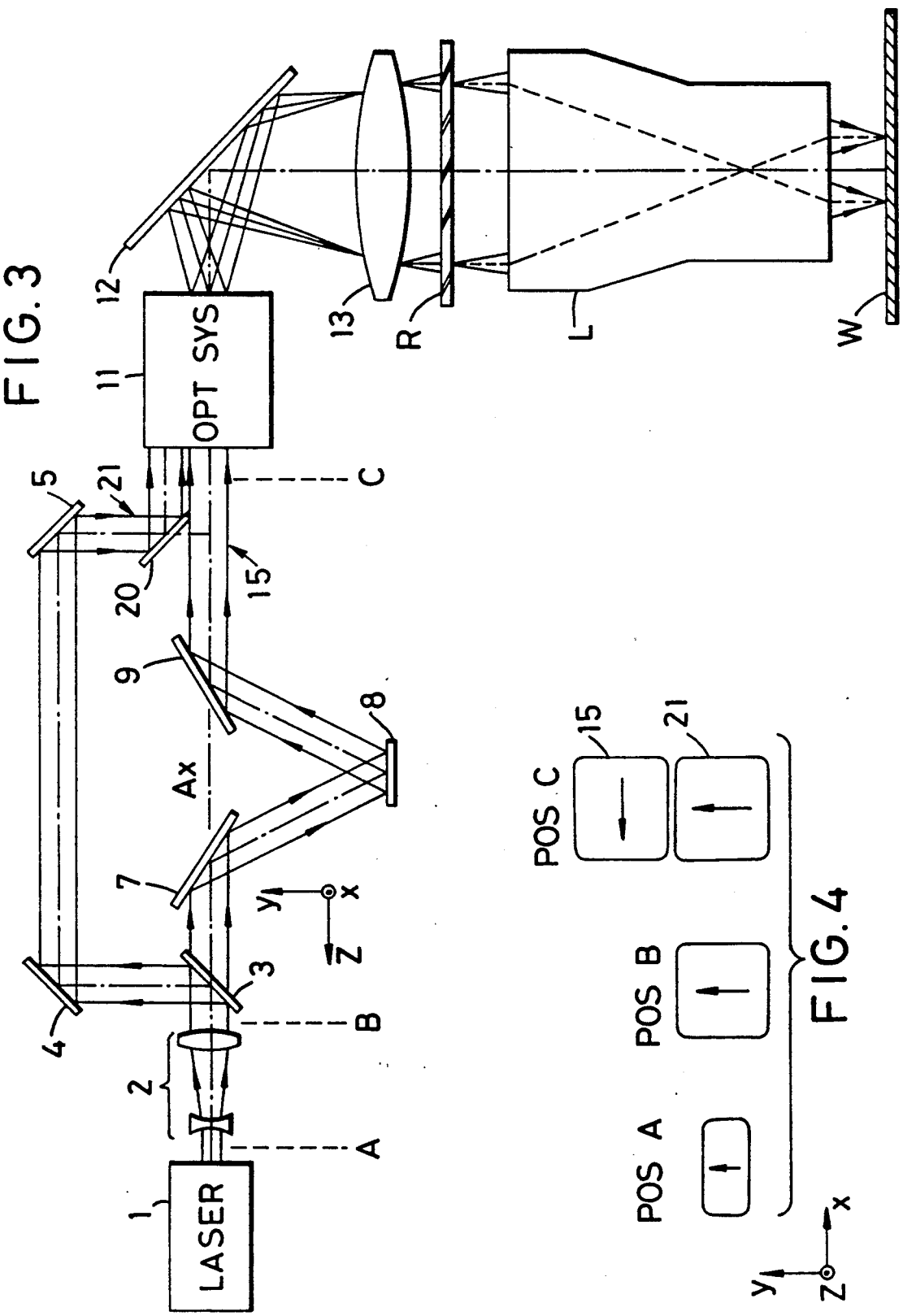

ILLUMINATING OPTICAL SYSTEM IN AN EXPOSURE APPARATUS

BACKGROUND OF THE INVENTION

1. Field of the Invention

This invention relates to an exposure apparatus for transferring patterns, and in particular to an illuminating optical system using a laser source.

2. Related Background Art

An exposure apparatus having as a light source an excimer laser emitting deep ultra-violet rays has drawn attention as a transfer apparatus for fine LSI patterns smaller than 0.5 μm rule. Particularly, an apparatus of the type which uses a band-narrowed laser whose oscillation wavelength width is narrowed, and which reduction-exposes the pattern of a negative such as a reticle or a mask onto a photosensitive substrate such as a wafer by a projection lens using only quartz as an optical material is expected to be put into practical use soon.

An excimer laser source has an asymmetrical light flux density distribution and therefore causes illumination distribution irregularity in a negative illuminated. U.S. Pat. No. 4,769,750 proposes an illuminating optical system which solves this problem.

Further, a beam emitted from an excimer laser source has the tendency that spatial coherence is high. For example, when an injection locking laser of the master and slave type is used, there is provided an illuminating light which is small in the number of oscillation modes and high in coherency, and unnecessary interference fringes called speckles superposed on the transferred pattern tend to appear on a wafer.

Also in a narrow-band laser in which an etalon (what is provided with two parallel flat plates of quartz disposed at a predetermined interval) or a spectral grating is inserted into a laser resonator to keep the beam diameter large and, in which the number of oscillation modes is not increased, there has been the problem that spatial coherence is higher than before the band is narrowed and particularly, for a direction in which the angle of divergence of the beam is small, spatial coherence is high and unnecessary interference fringes tend to appear.

U.S. Pat. No. 4,619,508 teaches several methods for forming an incoherent light beam from a coherent light beam.

SUMMARY OF THE INVENTION

It is an object of the present invention to provide a novel illuminating optical system which suppresses occurrence of interference fringes when a laser, emitting a light beam which is high in spatial coherence, is used as a light source.

It is another object of the present invention to provide an exposure apparatus using such a said illuminating optical system.

The illumination optical system in the present invention is designed to divide a laser beam from a laser source into two beams, rotate one beam by about 90° with respect to the direction of travel of the beams, thereafter superpose the two beams substantially coaxially or substantially parallel to each other, and use the superposed beams for the illumination of a negative in an exposure apparatus. Thereby, in a plane perpendicular to the direction of travel of the beams, the spatial coherences for two directions orthogonal to each other can be made substantially equal.

BRIEF DESCRIPTION OF THE DRAWINGS

FIG. 1 shows the construction of an exposure apparatus provided with an illumination system according to a first embodiment of the present invention.

FIG. 2 shows the beam shapes in various positions of the laser beams in FIG. 1.

FIG. 3 shows the construction of an exposure apparatus provided with an illuminating system according to a second embodiment of the present invention.

FIG. 4 shows the beam shapes in various positions of the laser beams in FIG. 3.

DESCRIPTION OF THE PREFERRED EMBODIMENTS

FIG. 1 shows the optical arrangement of a first embodiment of the present invention. The reference numeral 1 designates a laser source whose spectrum is narrowed, and the reference numeral 2 denotes a beam expander including a cylindrical lens system and adapted to expand a beam only in a one-dimensional direction. In the present embodiment, it expands the beam width only in a direction y. The laser source 1 is of the type which contains an etalon in a resonator, and its polarization is random. The reference numeral 3 designates a polarizing beam splitter transmitting therethrough a polarized component whose electric field is in the plane of the drawing sheet (P-polarized light) and reflecting a polarized component perpendicular to the plane of the drawing sheet (S-polarized light). The reference numeral 6 denotes a similar polarizing beam splitter. The reference numerals 4, 5, 7, 8 and 9 designate ordinary reflecting mirrors. The beam of S-polarized-component reflected by the polarizing beam splitter 3 is reflected by the mirrors 4 and 5 and reflected by the polarizing beam splitter 6, whereafter it enters an illumination intensity uniformizing optical system 11. The beam of P-polarized component transmitted through the polarizing beam splitter 3 is rotated about a horizontal optic axis AX by a beam rotator comprised of the mirrors 7, 8 and 9. The incidence-reflection surfaces of the mirrors 7, 8 and 9 are inclined at 45° with respect to the plane of the drawing sheet. That is, the mirrors 7, 8 and 9 are rotated as a unit by 45° about the optic axis AX. Therefore, the beam after being reflected by the mirror 9 is rotated in beam shape by 90° relative to the beam before entering the mirror 7, and is also rotated in polarization by 90°. Accordingly, if a half wavelength plate 10 made of quartz or the like is provided between the mirror 9 and the polarizing beam splitter 6, a beam 15 passed through the half wavelength plate becomes P-polarized light to the polarizing beam splitter 6 and is coaxially superposed on a beam 14 of S-polarized light from the mirror 5, and enters the uniformizing optical system 11.

FIG. 2 shows the cross-sectional shapes of the laser beams in various positions A, B and C. In FIG. 2 (and also in FIG. 4), the solid arrows designate a predetermined direction (in this case the y direction), and the dashed arrow shows rotation of beam 15. of the laser beams in various positions A, The cross-section of the output beam in the position A, i.e., immediately after the beam is emitted from the laser source 1, is wide in the direction of one-dimension x. This beam is smaller in the angle of beam divergence in the direction y and higher in spatial coherence in the direction y than in a direction x. The cross-sectional shape of the laser beam in the position B, i.e., after the beam has passed through the beam expander 2 of the cylindrical system, is of substantially the same width with respect to the directions x and y, and is much higher in spatial coherence in the direction y than in the direction x.

The cross-sectional shape of the beam in the position C, i.e., after super-position by the polarizing beam splitter 6, is due to the beams 14 and 15 being substantially coaxially superposed one upon the other. In this state, spatial coherences become equal with respect to the two directions x and y.

The illumination intensity uniformizing optical system 11 into which the superposed beams 14 and 15 enter includes a fly-eye lens or the like as well as an optical system such as a scanning mirror for reducing speckles. A combination of the fly-eye lens and the scanning mirror is disclosed in detail in U.S. Pat. No. 4,619,508. The light beam having emerged from the uniformizing optical system 11 illuminates with a uniform intensity of illumination a reticle R, which is a negative through a reflecting mirror 12 and a condenser lens 13, and a projection lens L is adapted to form the image of a pattern lying under the reticle R on the photosensitive layer of the upper surface of a wafer W. In the present embodiment, an illuminating system for an exposure apparatus is constituted by the laser source 1, the beam expander 2, the beam splitters 3, 6, the mirrors 4, 5, 7, 8, 9 and the half wavelength plate 10.

In the above-described first embodiment, use is made of the laser source 1 using an etalon to emit a beam whose polarization is random, but where use is made of a laser source whose spectrum is narrowed by the use of a dispersing element of a substantial polarizing characteristic such as a prism or a grating, the output beam of the laser source is polarized in one direction. In such case, the polarizing beam splitter 3 of FIG. 1 may be replaced with a beam splitter which does not have a polarizing characteristic and renders the intensity ratio between the reflected light and the transmitted light into 1:1, and the half wavelength plate 10 may be eliminated.

In FIG. 1, the beam expander 2 is provided forwardly of the beam splitter 3, but in some cases the beam expander 2 need not be provided or it may be provided rearwardly of the beam splitter 6.

Also, the illumination intensity uniformizing optical system 11 may in some cases lead to a better result for the purpose of reducing the spatial coherence if an optical system for reducing speckles (a scanning mirror, a fly-eye lens, fiber, etc.) is provided forwardly of the beam splitter 3.

Besides the example in which the beams are rotated by 90° and superposed one upon the other, there is conceivable an example in which, for example, a beam is divided into three beams and beams rotated by 120° and 240°, respectively, are superposed on the original beam which is not rotated, and in such case, the energy loss when the beams are superposed becomes unavoidably great, but such example is effective for eliminating the directionality of spatial coherence. Accordingly, it is also covered as a mode of the present invention to divide a beam into three or more beams in this manner.

In the above-described first embodiment, the polarizing beam splitter 6 is used as the technique of again superposing the beams divided into two one upon the other, but if a partial reflecting mirror is used instead of it, an optical arrangement which is inexpensive and does not depend on the direction of polarization will become possible.

FIG. 3 shows the construction of an exposure apparatus according to a second embodiment of the present invention. A partial mirror 20 is provided instead of the beam splitter 6 shown in FIG. 1, and the original unrotated beam 21 reflected at a right angle by this partial mirror 20 and the 90°-rotated beam 15 transmitted through the side of the partial mirror 20 are not coaxial with each other, and enter the uniformizing optical system 11 substantially in parallelism to each other. In the other points, the second embodiment is the same as the embodiment of FIG. 1 with the exception that the half wavelength plate 10 is eliminated.

In the case of the present embodiment, the optic axis of the projection lens L and the center axes of the beams 21 and 15 are eccentric with one another.

FIG. 4 shows the cross-sectional shapes of the beams in positions A, B and C. The cross-sectional shapes in the positions A and B both are the same as those shown in FIG. 2. In the position C, the beams 21 and 15 rotated by 90° with respect to each other are eccentric with each other substantially by an amount corresponding to the widthwise dimension of the beams in the direction y, and their optical paths are completely separated from each other. In the present embodiment, the cross-sectional shape enveloping the beams 21 and 15 entering the uniformizing optical system 11 does not become square, but a beam expander (cylindrical lens) in a one-dimensional direction can be provided at a position short of the position at which the beams 21 and 15 enter the uniformizing optical system 11, thereby again making the cross-sectional shapes of the entire beams 21 and 15 approximate to a square.

In each of the above-described embodiments, one or more additional sets of optical systems leading from the beam splitter 3 to the beam splitter 6 may be disposed in series between the laser source and the reticle R so as to reduce speckles. Further, it is assumed that an excimer laser is used in each of the above-described embodiments, but even in a case where another laser such as a solid state laser or a gas laser is used, a similar effect can be obtained, and the present invention can also be applied to various types of apparatuses which use not a band-narrowed laser but a laser source such as an argon ion laser of the type which originally effects narrowband oscillation. The type of the exposure apparatus is not restricted to projection exposure, but the present invention is also applicable to an exposure apparatus of the proximity or contact type.

Also, in each embodiment of the present invention, it has been a premise to apply it to an exposure apparatus, but the present invention is equally applicable to an alignment apparatus or a wafer inspecting apparatus in which a laser source having similar problems is used as an illuminating system for the observation of an object surface and the minute structure of the object surface is enlarged and observed by means of a TV camera or the like.

What is claimed is:

1. Apparatus including an illuminating optical system for illuminating an area of an object with light that is substantially equally spatially coherent along different directions in said area, said system comprising:

means for producing a beam of light having spatial coherence that is different along different directions perpendicular to a propagation direction of said beam;

means for dividing said beam into a plurality of beams;

means for rotating at least one of said plurality of beams relative to the others about an axis substantially parallel to the direction of propagation thereof; and means for superposing said plurality of beams, including the at least one rotated beam, upon said area of said object;

said rotating means rotating said at least one beam by an amount that causes light illuminating said area to have substantially equal spatial coherence along different directions in said area.

2. Apparatus according to claim 1, wherein said dividing means divides the produced beam into first and second beams, and said rotating means rotates said first and second beams relative to each other by about 90°.

3. Apparatus according to claim 2, wherein said rotating means includes a beam rotator provided in an optical path of said first beam.

4. Apparatus according to claim 3, wherein said beam rotator rotates the polarization of said first beam by about 90°, and said superposing means includes a polarizing beam splitter to which the rotated first beam and the second beam are applied, and further comprising a half-wave plate in the path of said rotated first beam before that beam is applied to said polarizing beam splitter.

5. Apparatus according to claim 1, wherein said dividing means includes a polarizing beam splitter which divides the produced beam according to directions of polarization thereof.

6. Apparatus according to claim 1, wherein said illuminating optical system comprises means for providing a substantially uniform light intensity distribution throughout said area of said object.

7. Apparatus according to claim 6, wherein said means for providing substantially uniform light intensity distribution follows said superposing means.

8. Apparatus according to claim 1, wherein the produced light beam has a substantially rectangular cross section in which the spatial coherence is different along orthogonal cross sectional directions.

9. Apparatus according to claim 8, wherein said illuminating optical system includes means for converting said substantially rectangular cross section to a substantially square cross section.

10. Apparatus according to claim 1, wherein said light beam producing means comprises a laser.

11. Apparatus according to claim 1, wherein said apparatus is an exposure apparatus for transferring a pattern provided on said area of said object onto a workpiece, and wherein said exposure apparatus includes a projection lens system having means for projecting an image of the illuminated area of said object onto said workpiece.

12. An exposure apparatus for transferring a pattern provided on an area of an object onto a workpiece, said exposure apparatus including an illuminating optical system for illuminating said area with light that is substantially equally spatially coherent along different directions in said area, said system comprising:

means for producing a beam of light having spatial coherence that is different along different directions perpendicular to a propagation direction of said beam:

means for dividing said beam into a plurality of beams;

means for rotating at least one of said plurality of beams relative to the others about an axis substantially parallel to the direction of propagation thereof; and means for superposing said plurality of beams, including the at least one rotated beam, upon said area of said object;

said rotating means rotating said at least one beam by an amount that causes light illuminating said area to have substantially equal spatial coherence along different directions in said area.

13. An exposure apparatus according to claim 12, wherein said exposure apparatus comprises a projection lens system including means for projecting an image of the illuminated area of said object onto said workpiece.

14. An exposure apparatus according to claim 12, wherein said dividing means divides the produced beam into first and second beams, and said rotating means rotates said first and second beams relative to each other by about 90°.

15. An exposure apparatus according to claim 14, wherein said rotating means includes a beam rotator provided in an optical path of said first beam.

16. An exposure apparatus according to claim 15, wherein said beam rotator rotates the polarization of said first beam by about 90°, and said superposing means includes a polarizing beam splitter to which the rotated first beam and the second beam are applied, and further comprising a half-wave plate in the path of said rotated first beam before that beam is applied to said polarizing beam splitter.

17. An exposure apparatus according to claim 12, wherein said dividing means includes a polarizing beam splitter which divides the produced beam according to the directions of polarization thereof.

18. An exposure apparatus according to claim 12, wherein said illuminating optical system comprises means for providing a substantially uniform light intensity distribution throughout said area of said object.

19. An exposure apparatus according to claim 18, wherein said means for providing substantially uniform light intensity distribution follows said superposing means.

20. An exposure apparatus according to claim 12, wherein the produced light beam has a substantially rectangular cross section in which the spatial coherence is different along orthogonal cross sectional directions.

21. An exposure apparatus according to claim 20, wherein said illuminating optical system includes means for converting said substantially rectangular cross section to a substantially square cross section.

22. An exposure apparatus according to claim 12, wherein said light beam producing means comprises a laser.

* * * * *